(12) United States Patent
Schuurmans

(10) Patent No.: US 9,419,640 B2
(45) Date of Patent: *Aug. 16, 2016

(54) CONTROL OF A MICROPHONE

(75) Inventor: Han M. Schuurmans, Cuijk (NL)

(73) Assignee: NXP B.V., Eindhoven (NL)

( * ) Notice: Subject to any disclaimer, the term of this patent is extended or adjusted under 35 U.S.C. 154(b) by 659 days.

This patent is subject to a terminal disclaimer.

(21) Appl. No.: 13/580,153

(22) PCT Filed: Mar. 16, 2011

(86) PCT No.: PCT/IB2011/051104
§ 371 (c)(1),
(2), (4) Date: Aug. 21, 2012

(87) PCT Pub. No.: WO2011/114300
PCT Pub. Date: Sep. 22, 2011

(65) Prior Publication Data
US 2012/0328129 A1    Dec. 27, 2012

(30) Foreign Application Priority Data
Mar. 17, 2010 (EP) ..................... 10156808

(51) Int. Cl.
*H03M 1/18* (2006.01)
*H03M 3/00* (2006.01)
*H04R 3/02* (2006.01)

(52) U.S. Cl.
CPC .............. *H03M 1/183* (2013.01); *H03M 3/48* (2013.01); *H04R 3/02* (2013.01); *H04R 2410/00* (2013.01)

(58) Field of Classification Search
None
See application file for complete search history.

(56) References Cited

U.S. PATENT DOCUMENTS

| | | | |
|---|---|---|---|
| 6,473,662 B2 * | 10/2002 | Lubbe ................... | H03G 7/007 381/104 |
| 6,577,737 B1 * | 6/2003 | Krochmal ............... | H03F 1/303 381/120 |
| 8,625,809 B2 * | 1/2014 | Josefsson et al. ................. | 381/8 |
| 2006/0210096 A1 | 9/2006 | Stokes, III et al. | |
| 2007/0035430 A1 | 2/2007 | Schreier et al. | |
| 2008/0218395 A1 | 9/2008 | Tomioka et al. | |
| 2009/0003629 A1 * | 1/2009 | Shajaan et al. ................ | 381/113 |
| 2010/0052795 A1 | 3/2010 | Nakamura et al. | |
| 2013/0259242 A1 * | 10/2013 | Schuurmans et al. ......... | 381/56 |

FOREIGN PATENT DOCUMENTS

| | | |
|---|---|---|
| CN | 101621728 A | 1/2010 |
| CN | 101662260 A | 3/2010 |

(Continued)

OTHER PUBLICATIONS

Sigma-Delta ADCs and DACs, AN-283 Application Note, Analog Devices, 16 pages, 1993. downloaded from http//www.analog.com/UploadedFiles/Application-Notes/292524291525717240549236804581 71AN283.pdf.*

(Continued)

*Primary Examiner* — Curtis Kuntz
*Assistant Examiner* — Kenny Truong

(57) ABSTRACT

A microphone circuit has a clip detection circuit (30) which detects when an analog to digital converter (ADC, 12) output has reached a threshold. A variable capacitance (34a, 34b, 34c, 34d), which functions as a variable input load associated with the microphone (11), is controlled based on the clip detection circuit output, the feedback is thus based on the ADC output level, and the processing of this signal can be implemented without requiring baseband processing of the signal—it can simply be based on a state of the ADC output.

20 Claims, 2 Drawing Sheets

(56) References Cited

FOREIGN PATENT DOCUMENTS

| WO | 2009/150611 | A1 | 12/2009 |
| WO | 2010116326 | A2 | 10/2010 |

OTHER PUBLICATIONS

Extended European Search Report for European patent appln. No. EP10156808.7 (Jul. 26, 2010).

* cited by examiner

CONTROL OF A MICROPHONE

This invention relates to the control of a microphone.

Loudspeakers and microphones essentially comprise a movable diaphragm or other member which provides conversion between a sound pressure wave and an electrical signal.

It is well known that the output of a loudspeaker should be controlled in such a way that it is not simply driven by an input signal. For example, an important cause of loudspeaker failures is a mechanical defect that arises when the loudspeaker diaphragm is displaced beyond a certain limit, which is usually supplied by the manufacturer. Going beyond this displacement limit either damages the loudspeaker immediately, or can considerably reduce its expected life-time.

There exist several methods to limit the displacement of the diaphragm of a loudspeaker, for example by processing the input signal with variable cut-off filters (high-pass or other), the characteristics of which are controlled via a feedforward or feedback control loop.

A similar issue arises in connection with microphones. Microphones are moving from typical analogy microphones to digital microphones modules. These microphone modules typically consist of a sensor manufactured in a micro-electro-mechanical system (MEMS) process and an analogy to digital converter (ADC). The output of the ADC (typically a sigma delta type converter) is a PDM (pulse density modulation) stream that outputs the data to a baseband processor.

Normal acoustical levels are at about 94 dBSPL (1 pA of sound pressure). The voltage from the microphone sensor is 5 mV @ 94 dBSPL. A required signal to noise ratio for the module is typically 61 dB. This means 64 dB for the sensor and 64 dB for the ADC. The equivalent noise level at the ADC input is 3 uV.

The output voltage of the microphone sensor can be as high as 100 mV, which corresponds to 120 dBSPL. The dynamic range of the ADC then needs to be 90 dB.

For recordings made during rock concerts, very high sound pressure close to the concert speakers overloads the module. As result, the recording sounds distorted when listing afterwards. The MEMS sensor itself is capable of handling sound pressures up to 140 dBSPL before mechanical damage is likely to occur. However, the ADC cannot provide the required signal to noise ratio and is therefore the weakest link.

When there is background noise, particularly wind noise, high sound pressures levels can occur. This wind noise will also cause clipping of the ADC. Removing the noise afterwards in a noise canceller cannot be achieved without distortion, since the signals are distorted and non linear.

This invention is directed to this problem of overloading (clipping) of the ADC.

According to the invention, there is provided a microphone circuit as claimed in claim 1.

The invention enables an extension of the maximum sound pressure by providing variable attenuation based on clipping of the ADC. Early detection of clipping is possible such that fast attack can occur.

The variable attenuator comprises a variable input load, used to reduce the input signal until the ADC does not clip anymore.

The variable input load comprises a variable capacitance. This variable capacitance can then be in series with the capacitance of the microphone itself, so that a variable capacitor divider circuit is formed.

The variable capacitance can comprise an array of capacitors in parallel between the microphone output and a control terminal, wherein the capacitors of the array are individually switchable into or out of the parallel circuit. For example, the variable capacitance can comprise a binary weighted array of capacitors.

The control circuit can comprise a counter, which is controlled to increase in response to one of a clip-detection signal and a no-clip-detection signal, and to decrease in response to the other of the clip-detection signal and the no-clip-detection signal. Thus, when there is clipping, indicating that the ADC has reached its limit and the input sound pressure means that signal attenuation is required, a counter is changed, such that the capacitor network configuration is altered. Only when the clipping has stopped does the capacitor network configuration return to its previous state. This provides a simple control scheme.

The analogue to digital converter can comprise a 1 bit sigma delta converter with a pulse density modulation output. Clip detection can then be based on the pulse density modulation signal reaching a threshold. The threshold can for example comprise a given proportion of 1s in a given length bit stream.

The invention also provides a method of processing a microphone output signal, as claimed in claim 7.

An example of the invention will now be described in detail with reference to the accompanying drawings, in which.

The invention relates to a method of extending the dynamic range of the ADC in a microphone circuit.

There are several known ways to extend to dynamic range.

Figure 1:
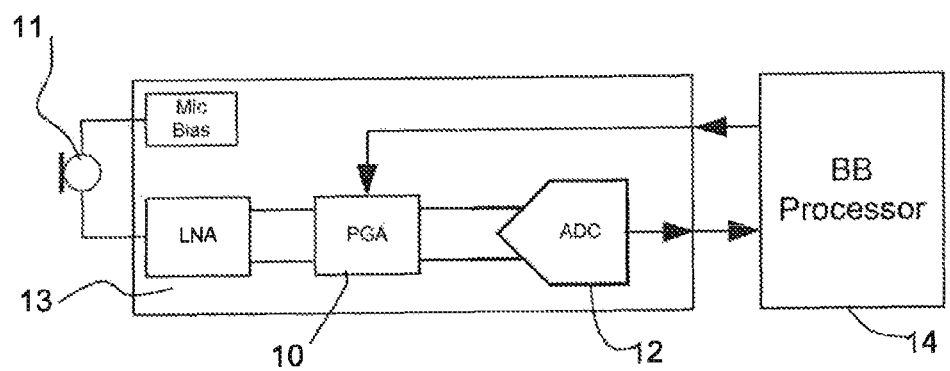
FIG. 1 shows a first known microphone circuit

A first example is shown in FIG. 1. A programmable gain amplifier (PGA) 10 (programmable from 0 to 20 dB attenuation in e.g. 1 dB steps) is provided at the input of the ADC 12. The programmable amplifier processes the signal of the microphone 11 amplified by an amplifier 13. A baseband (BB) processor 14 or other sub system implements the control, and the PGA 10 is set to the appropriate amplification level. A drawback is that the BB processor 14 determines the attack time and is slow. Also, the gain of the PGA (1 dB steps) needs to be compensated otherwise clicks can be audible during switching of the PGA.

Figure 2:
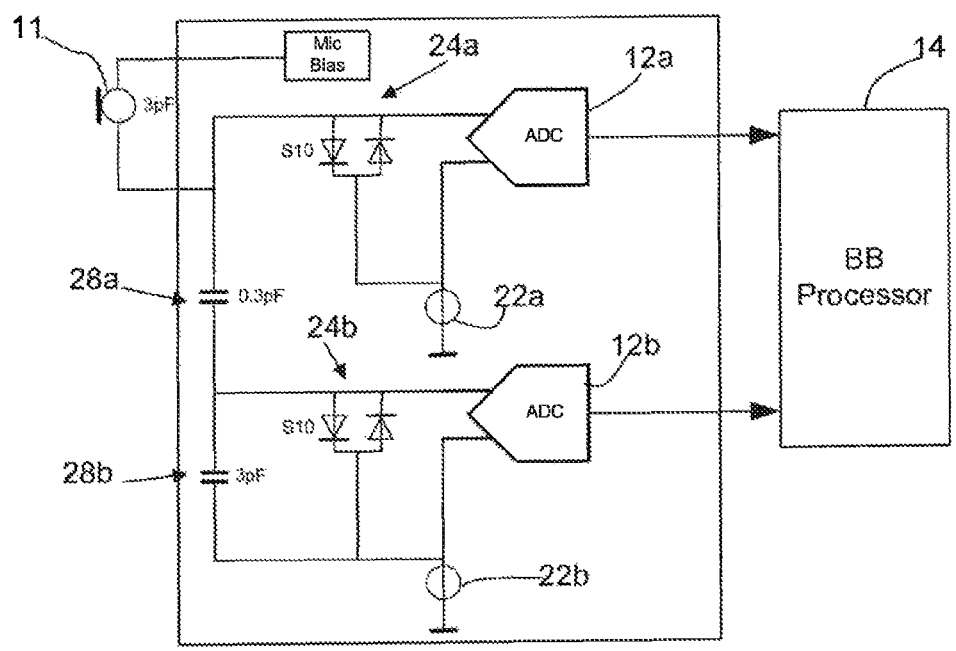
FIG. 2 shows a first known microphone circuit

In order to overcome the click issue it is also possible to provide two ADCs. A twin ADC arrangement is shown in FIG. 2. The standard ADC 12a handles 100 mV rms. The second ADC 12b handles 1 Vrms (20 dB more). The two paths have a different gain. Thus, there are two data streams (for example PDM streams) coupled to the BB processor 14. The BB processor needs to perform some post processing to combine the two streams into one undistorted signal. Switching over from one stream to the other stream can be very fast and is implemented inside the BB processor. Care needs to be taken in matching the 2 streams.

Each of the two ADCs has a control circuit in the form of a voltage reference source 22a,22b for setting the voltage on one input of the differential ADC converters, and a high impedance element 24a,24b between the ADC input terminals. In the example shown, this comprises two back to back diodes. These do no conduct, as the input voltage from the microphone is of the order of 100 mV and therefore below the conduction threshold of the diodes. They could be replaced by a different high impedance element. Each ADC circuit has a constant gain.

The different gains for the two paths are implemented by the capacitors 28a,28b which define a capacitor divider network with the capacitance of the microphone.

Compression/decompression systems can also be used. The microphone module then compresses the signal such that it fits the dynamic range of the ADC. In the BB processor, the inverse function is needed and decompresses the signal to regenerate an undistorted audio signal.

The disadvantage of these solutions is that the BB processor needs to implement the dynamic range extension of the microphone module. In all cases, the incoming signal needs to be amplified or attenuated.

This means that specialised control algorithms are required in the baseband controller. Because the control takes place outside the microphone module, a time lag can result in making the required adaptation to the microphone circuit characteristics. The BB processor will also need to have an extended dynamic range corresponding to the extending dynamic range of the microphone circuit.

The invention is based on an approach in which the microphone module itself implements the setting of the microphone gain.

The invention provides a microphone circuit in which a clip detection circuit detects when the analogue to digital converter output has reached a threshold. A variable attenuator, preferably in the form of a variable input load associated with the microphone, is controlled based on the clip detection circuit output. The feedback is thus based on the ADC output level, and the processing of this signal can be implemented without requiring baseband processing of the signal—it can simply be based on a state of the ADC output. As a result, the feedback path can be implemented within the microphone module and before the baseband processing. Thus, the detected signal used to provide feedback control is directly at the output of the ADC.

Since the sample frequency is high, the delay before a clip event is detected is very low. As such the attack time can be fast.

An amplification or attenuation is required, as in the systems described above. The microphone can be considered to have the electrical characteristics of a capacitor. The effective value is in the range of 3 pF. In one preferred implementation of the invention, the signal coming from the microphone sensor is attenuated by loaded with a (programmable) capacitor.

Figure 3:
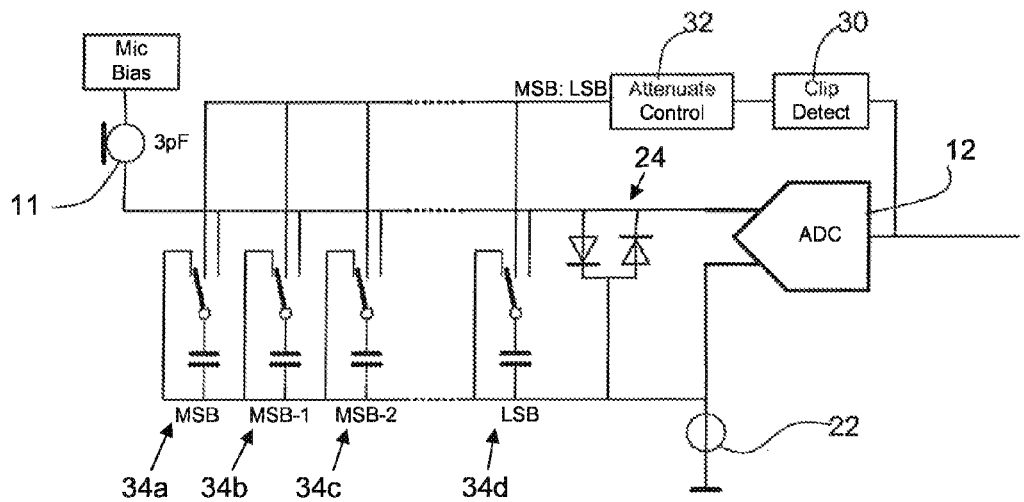
FIG. 3 shows an example of microphone circuit of the invention.

FIG. 3 shows an example of microphone circuit of the invention.

The ADCs are drive in the same way as explained with reference to FIG. 2, with a voltage reference source and a high impedance between the reference input and the microphone analogue input.

The output of the ADC 12 is provided to a clip detection circuit 30. By clipping is meant that the digital output has reached a threshold such that the ADC is at the limit of its preferred range of operation. This clipping can be at or near the maximum digital output of the ADC. However, the signal to noise ratio of the ADC can drop before this maximum value is reached, and the threshold can thus be set lower, for example at 70-90% of the maximum digital output.

The clip detection is used to cause attenuation of the microphone signal. An attenuation control unit 32 generates the required control signal.

The attenuation can be implemented in many different ways, including a programmable amplifier as shown in FIG. 1, but controlled directly by the output of the ADC 12. However, in a preferred implementation as shown in FIG. 3, a variable input load is provided. This is implemented in FIG. 3 as a binary weighted capacitive attenuator, comprising an array of capacitor-switch units 34a, 34b, 34c, 34d.

The array of capacitors is in parallel between the output of the microphone 11 and a control terminal (ground). The capacitors of the array are individually switchable into or out of the parallel circuit by the associated switches.

If a maximum attenuation of 20 dB needs to be achieved, the total capacitance needs a value which is about 10 times higher than the microphone capacitance. In the example of a 3 pF microphone, a maximum capacitance of 30 pF is required. Using a binary weighted function, the capacitors can be set at approximately 16 pF, 8 pF, 4 pF, 2 pF, 1 pF, 0.5 pF, 0.25 pF, 0.125 pF for an 8 bit attenuator. When all capacitors are switched on, the attenuation is maximum.

Figure 4:
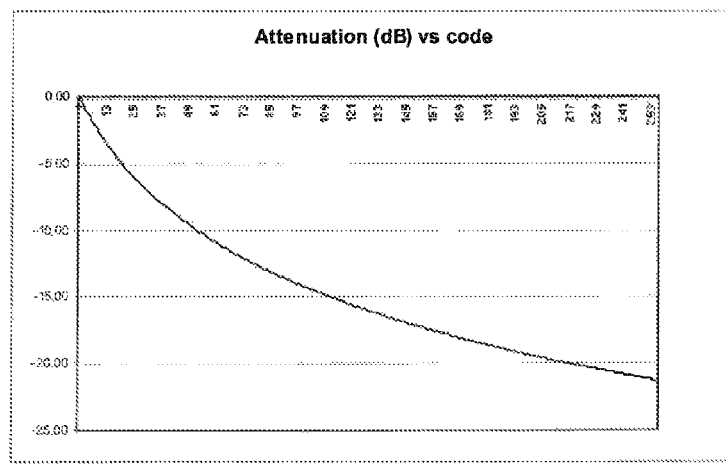
FIG. 4 is used to explain the control scheme employed in the circuit of FIG. 3.

FIG. 4 shows the attenuation as a function of code for the 8 bit control system outlined above.

The attenuator control can be implemented by means of an up/down counter. In one example, code 0 can signify no attenuation and code 255 signifies maximum attenuation.

As long as the clip detect is active, the counter counts up. This is done in a fast way (attack) and the speed can be programmable. A programmable increment value of 0.04, 0.08 or 0.16 can be used by way of example.

When no clip is detected, the counter counts slowly down, with programmable decrement value of 0.04e-3, 0.08e-3 or 0.16e-3 by way of example, i.e. a factor of 1000 slower than the response to the clip detect signal. However, the counter is running on the same clock as the ADC, so it counts very fast. The counter can be implemented as a real up/down counter, or implemented as a form of integrator.

The clip detector has as input the ADC output.

The type of ADC is typically a 1 bit sigma delta converter. The output is a PDM stream of 1 bit data. The pulse density for a given stream length ranges from 0% (all '0') up to 100% (all '1'). The ratio between actual number of '1' compared to the maximum number of '1' in a certain time frame of the data stream functions as threshold and determines the actual value of the input signal. For example, for a data stream of 10 bits, if 3 logical '1' values are received from the ADC, it means that a value of 30% of the maximum is coded.

The maximum undistorted output level of a 1 bit sigma delta ADC is in the range of 70%-80%, so that a clip detector can be based on counting the '1's in a stream of 10 bits with a threshold of 8 '1' values (80% of the maximum output). The clip detect signal then becomes active and as result the attenuator control reduces the input signal of the ADC. Since the clip detect acts on the ADC output and by examining 10 bits, a clip detect can be found within 10 clock cycles of the ADC. A typical clock frequency is in the range of 3 MHz. This results in a detection time of about 3 us (10×1/f).

This invention can be used in a digital microphone module, where increased dynamic range is needed to handle high load events, for example that exceed 120 dBSPL. The baseband processor does not require this extended dynamic range and as such a standard baseband processor can be used without modification.

If an extended dynamic range is needed inside the baseband processor or if a constant gain is needed (as in an acoustic echo canceller); the inverse function implemented by the attenuator can be implemented within the baseband processor. This can be implemented without requiring complicated feedback or feedforward paths, because the clip detect function is based on the PDM stream, which is available in both the microphone module as well as in the baseband processor.

The invention has been described with reference to a one bit sigma delta converter. However, the ADC clipping detection can be implemented with other converters, such as multi-bit sigma delta, mash and nyquist ADCs.

The static gain control has been shown based on a differential ADC with a reference voltage to one input. However, other control or biasing schemes can be combined with the attenuation control of the invention.

The capacitor array can be replaced with a different variable load, for example not a purely capacitive load, as long as the result is that the microphone signal is attenuated before being processed by the analogue to digital converter.

The values of capacitances above are only by way of example, and the invention can be applied to different microphone designs. The concept of the invention is the use of the digital level of the analogy to digital converter as a parameter which controls an attenuation function of the microphone electrical output signal.

Various modifications will be apparent to those skilled in the art.

The invention claimed is:

1. A microphone circuit comprising:
a microphone;
an analogue to digital converter at an output of the microphone, the analogue to digital converter including a sigma delta converter configured to generate a pulse density modulation output;
a clip detection circuit for detecting when the pulse density modulation output of the analogue to digital converter has reached a threshold, the clip detection circuit configured to generate an output in response to the pulse density modulation output;
a variable capacitance which functions as a variable input load associated with the microphone; and
a control circuit for controlling the variable capacitance based on the clip detection circuit output, wherein the control circuit includes a counter circuit, which is controlled to increase or decrease a count in response to the clip detection circuit generating a detection signal indicative of whether clipping has been detected.

2. A circuit as claimed in claim 1, wherein the variable capacitance comprises an array of capacitors in parallel between the microphone output and a control terminal, wherein the capacitors of the array are individually switchable into or out of the parallel circuit.

3. A circuit as claimed in claim 2, wherein the variable capacitance comprises a binary weighted array of capacitors.

4. A circuit as claimed in claim 1, wherein the counter circuit is controlled to increase a count in response to one of a clip-detection signal and a no-clip-detection signal, and to decrease the count in response to the other of the clip-detection signal and the no-clip-detection signal.

5. A circuit as claimed in claim 1, wherein the sigma delta converter comprises a 1 bit sigma delta converter configured to generate the pulse density modulation output, the pulse density modulation output provided to the clip detection circuit as feedback and provided to a baseband processor.

6. A circuit as claimed in claim 5, wherein clip detection signal is based on the pulse density modulation output reaching a threshold ratio of: number of bits in a bit stream that are a common polarity in a time period versus a total number of bits in the bit stream in the time period.

7. A method of processing a microphone output signal, comprising:
converting the microphone output signal to a pulse modulation output, in digital form, using an analogue to digital converter, wherein the analogue to digital converter includes a sigma delta converter;
providing the pulse modulation output as feedback to a clip detection circuit;
implementing clip detection by detecting when the pulse modulation output has reached a threshold using the clip detection circuit; and
controlling a variable capacitance which functions as a variable input load associated with the microphone based on the clip detection including operating a counter by increasing or decreasing a count in response to the output from the clip detection circuit including a detection signal indicative of whether clipping has been detected.

8. A method as claimed in claim 7, wherein the variable capacitance comprises an array of parallel capacitors and controlling the variable input load comprises individually switching capacitors of the array into or out of circuit.

9. A method as claimed in claim 7, wherein operating the counter includes increasing a count in response to one of a clip-detection signal and a no-clip-detection signal, and decreasing the count in response to the other of the clip-detection signal and the no-clip-detection signal.

10. A method as claimed claim 7, wherein the converting comprises using a 1 bit sigma delta converter configured to generate the pulse density modulation output.

11. A method as claimed in claim 10, outputting a clip detection signal by the clip detection circuitry, in response to the pulse density modulation output reaching a threshold ratio of: number of bits in a bit stream that are a common polarity in a time period versus a total number of bits in the bit stream in the time period.

12. A circuit as claimed in claim 1, wherein the analogue to digital converter is configured to directly provide the pulse modulation output to the clip detection circuit.

13. A circuit as claimed in claim 1, wherein the sigma delta converter comprises a multi-bit sigma delta converter.

14. A method as claimed in claim 7, wherein implementing the clip detection includes detecting the pulse density modulation output reaches a threshold ratio of bits that are one in a time period.

15. A method as claimed in claim 7, wherein providing the pulse modulation output as feedback to the clip detection circuit includes directly providing the pulse modulation output from the analogue to digital converter to the clip detection circuit.

16. A microphone circuit comprising:
a microphone;
an analogue to digital converter at an output of the microphone, the analogue to digital converter including a sigma delta converter configured to generate a pulse density modulation output;
a clip detection circuit configured to detect the pulse density modulation output of the analogue to digital converter reaching a threshold ratio of number of bits in a bit stream that are a common polarity in a time period versus a total number of bits in the bit stream in the time period, the clip detection circuit further configured to generate and output a clip detection signal in response to the pulse density modulation output reaching the threshold ratio;
a variable capacitance which functions as a variable input load associated with the microphone; and
a control circuit configured to control the variable capacitance based on the clip detection signal, wherein the control circuit includes a counter circuit, which is controlled to increase or decrease a count in response to the clip detection circuit generating the detection signal indicative of whether clipping has been detected.

17. A circuit as claimed in claim 16, wherein the control circuit is further configured to control the counter circuit by increasing a count in response to one of a clip-detection signal and a no-clip-detection signal, and by decreasing the count in response to the other of the clip-detection signal and the no-clip-detection signal.

18. A circuit as claimed in claim 16, wherein the analogue to digital converter is further configured to provide the pulse modulation output as feedback to the clip detection circuit.

19. A circuit as claimed in claim 16, wherein the analogue to digital converter is further configured to provide the pulse modulation output as feedback directly from the analogue to digital converter to the clip detection circuit.

20. A circuit as claimed in claim 16, wherein the sigma delta converter comprises a 1 bit sigma delta converter configured to generate the pulse density modulation output, the pulse density modulation output provided to the clip detection circuit as feedback and provided to a baseband processor.

* * * * *